United States Patent
Chou et al.

(10) Patent No.: US 7,531,438 B2
(45) Date of Patent: May 12, 2009

(54) METHOD OF FABRICATING A RECESS CHANNEL TRANSISTOR

(75) Inventors: Jih-Wen Chou, Hsinchu (TW); Chih-Hsun Chu, Hsinchu (TW); Hsiu-Chuan Shu, Jhubei (TW)

(73) Assignee: ProMOS Technologies Inc., Hsinchu (TW)

( * ) Notice: Subject to any disclaimer, the term of this patent is extended or adjusted under 35 U.S.C. 154(b) by 277 days.

(21) Appl. No.: 11/491,137

(22) Filed: Jul. 24, 2006

(65) Prior Publication Data

US 2007/0249123 A1    Oct. 25, 2007

(30) Foreign Application Priority Data

Apr. 20, 2006    (TW) ............................ 95114166 A

(51) Int. Cl.
*H01L 21/3205* (2006.01)
(52) U.S. Cl. .................. 438/589; 438/524; 438/525; 438/766; 438/981
(58) Field of Classification Search ............ 438/259, 438/524–525, 527, 530, 589, 766, 981
See application file for complete search history.

(56) References Cited

U.S. PATENT DOCUMENTS

| 5,270,257 | A  | * | 12/1993 | Shin ........................... 438/300 |
| 2005/0045944 | A1 | * | 3/2005 | Gratz et al. ................. 257/330 |
| 2005/0167741 | A1 | * | 8/2005 | Divakaruni et al. ......... 257/328 |
| 2007/0057288 | A1 | * | 3/2007 | Kim et al. ................... 257/192 |
| 2007/0090452 | A1 | * | 4/2007 | Cho et al. ................... 257/330 |
| 2007/0138545 | A1 | * | 6/2007 | Lin et al. .................... 257/330 |
| 2007/0246755 | A1 | * | 10/2007 | Lee et al. .................... 257/288 |

* cited by examiner

*Primary Examiner*—M. Wilczewski
*Assistant Examiner*—Toniae M Thomas
(74) *Attorney, Agent, or Firm*—Muncy, Geissler, Olds & Lowe, PLLC

(57) ABSTRACT

A method of fabricating a recess channel transistor is provided. First, a hard mask is formed on a doped-semiconductor layer and a substrate. The doped-semiconductor layer and the substrate are etched to form a trench and define a source/drain in the doped-semiconductor layer. An implantation process is performed with a tilt angle on sidewalls of the trench to form an implant area. A thermal oxidation process is performed to form an oxide layer. The oxide layer comprises a first thickness on the source/drain in the sidewalls of the trench and a second thickness on the other portion in the sidewalls of the trench.

15 Claims, 5 Drawing Sheets

METHOD OF FABRICATING A RECESS CHANNEL TRANSISTOR

RELATED APPLICATIONS

The present application is based on, and claims priority from, Taiwan Application Serial Number 95114166, filed Apr. 20, 2006, the disclosure of which is hereby incorporated by reference herein in its entirety.

BACKGROUND

1. Field of Invention

The present invention relates to a method of fabricating a recess channel transistor. More particularly, the present invention relates to a method to form a thicker oxide layer on the sidewalls of a trench.

2. Description of Related Art

With increased integrated circuit development, sub-micron generation is developed and the device sizes are becoming smaller. However, reduction of the device size generates short channel effects resulting from smaller channel lengths.

Thus, a recess channel array transistor (RCAT) was proposed to overcome this problem. In comparison with traditional metal oxide semiconductor transistors, the recess channel transistor can reduce short channel effects. Switch speed of the transistor is related to thickness of a gate oxide in the recess channel transistor and thereby the thickness of the gate oxide on the trench is an important design. Generally speaking, the transistor speed increases when the gate oxide formed on the sidewalls, which overlap a source/drain, are thicker and the gate oxide formed on the bottom layer is thinner.

Traditional recess channel array transistor fabrication method initially requires a trench to be formed in a substrate. Thermal oxidation caused by a rapid thermal process forms a gate oxide on the sidewalls of the trench. However, the difficulty of the traditional method is that a thicker gate oxide on the sidewalls of the trench cannot be obtained because the thickness of the gate oxide in the traditional method is uniform. Therefore, the switch speed would be decreased, and problems for gate induced drain leakage (GIDL) and parasitic capacitance would be produced. To form a thicker gate oxide on the sidewalls of the trench and a thinner gate oxide on the bottom of the trench, several thermal oxidation processes need to be performed and thus the manufacturing process becomes complicated and inconvenient.

Thus, there is a need to provide a method to fabricate a recess channel transistor to solve these problems.

SUMMARY

In one aspect, this present invention provides a method of fabricating a recess channel transistor that can obtain different thickness of an oxide layer on sidewalls and on a bottom of a trench by performing one thermal oxidation process.

In another aspect, this present invention provides a method of fabricating a recess channel transistor to solve problems for gate induced drain leakage.

In still another aspect, this present invention provides a method of fabricating a recess channel transistor to reduce parasitic capacitance effects derived from overlapping a source/drain and a gate.

In accordance with the foregoing and other aspects of the present invention, the present invention provides a method of fabricating a recess channel transistor comprising the following steps. First, a sacrificial oxide layer is formed on a substrate. Then, a first implantation process is performed to implant ions on an upper surface of the substrate to form a doped-semiconductor layer. After a patterned silicon nitride layer and a patterned sacrificial oxide layer are sequentially formed on the doped-semiconductor layer, the exposed doped-semiconductor layer and the substrate is etched to form a trench therein, and then the two portions of doped semiconductor layer separated by the trench are defined as source/drain regions. After forming a photoresist on the bottom of the trench, a second implantation process with a tilt angle is performed to implant ions into the source/drain region from the sidewalls of the trench and form implantation area in the source/drain region. The purpose of the implantation area in the source/drain region is to increase the speed of oxidation for forming an oxide layer on sidewalls of the trench. The implantation area is located on the source/drain region and the adjacent sidewalls of the trench. After removing the photoresist, a thermal oxidation process is performed to form an oxide layer on the sidewalls and on the bottom of the trench. Finally, after removing the patterned silicon nitride and patterned sacrificial oxide layer, a gate is formed in the trench and a recess channel transistor is formed.

The oxide layer comprises a first thickness on the source/drain region in the sidewalls of the trench and a second thickness on the other portion of the trench. The first thickness is thicker than the second thickness. According to one embodiment of the present invention, the thickness of the first thickness is between 1.5 and 4 times thicker than the second thickness.

Thus, by using an implantation process with a tilt angle to implant ions in the source/drain region form the sidewalls of the trench, the present invention increase the speed of oxidation for form a gate oxide on portion of the sidewalls of a trench. According to one embodiment of the present invention, ions, such as phosphorous, gallium, arsenic, silicon, boron, argon, fluorine or oxygen, are used to destroy the lattice structure of the active area, or ions with oxidation property, such as oxygen, are used to increase the oxidation speed for forming the oxide layer on the sidewalls of the trench to obtain thicker oxide layer on the exposed surface of the source/drain region in the trench during the thermal oxidation process.

Alternatively, in another embodiment, an implantation process is performed on the doped semiconductor layer, and then a trench is formed after the implantation process. First, a patterned silicon nitride layer and a patterned sacrificial oxide layer are sequentially formed on a doped-semiconductor layer. The patterned silicon nitride layer and the patterned sacrificial oxide layer comprise an opening to expose the doped-semiconductor layer. Then, a second implantation process is performed with a tilt angle on the doped-semiconductor layer to form an implant area. The implant area is wider than the opening of the patterned silicon nitride layer. The exposed implant area and the substrate are etched to form a trench and then the two portions of doped semiconductor layer separated by the trench are defined as source/drain regions. An oxide layer is formed on the sidewalls and on the bottom of the trench by performing a thermal oxidation process. Finally, after removing the patterned silicon nitride and patterned sacrificial oxide layer, a gate is formed on the trench and a recess channel transistor is formed.

Thus, the present invention provides a method of fabricating a recess channel transistor with gate oxide located between the gate and the channel and isolation oxide located between the gate and source/drain regions. The isolation oxide has a thicker thickness than the gate oxide. Moreover, the present invention not only solves problems for gate induced drain leakage, but also reduces parasitic capacitance effects derived from overlapping a source/drain and a gate. Furthermore, the gate oxide and the isolation oxide are formed by performing one thermal oxidation process.

BRIEF DESCRIPTION OF THE DRAWINGS

The invention can be more fully understood by reading the following detailed description of the preferred embodiment, with reference made to the accompanying drawings as follows.

DESCRIPTION OF THE PREFERRED EMBODIMENTS

Figure 1:
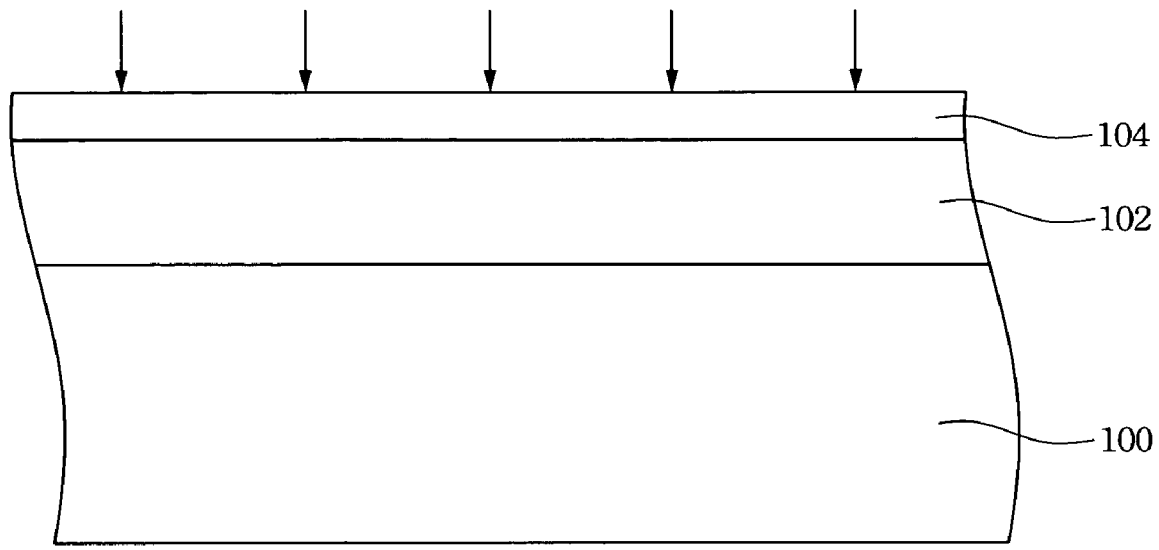
FIG. 1 to 8 illustrate the step by step cross-sectional diagrams showing a recess channel array transistor according to one embodiment of the present invention.

FIG. 1 to 8 illustrate the step by step cross-sectional diagrams showing a recess channel transistor according to one embodiment of the present invention. First, a sacrificial oxide layer 104 is formed on a substrate 100. In FIG. 1, a first implantation process is performed to implant ions on an upper surface of the substrate 100 to form a doped-semiconductor layer 102. The doped-semiconductor layer 102 is used for forming the source/drain region in the following process. The doped-semiconductor layer 102 is preferably N type doping. Then, an anneal process is performed to re-arrange the lattice structure of the doped-semiconductor layer 102.

Figure 2:
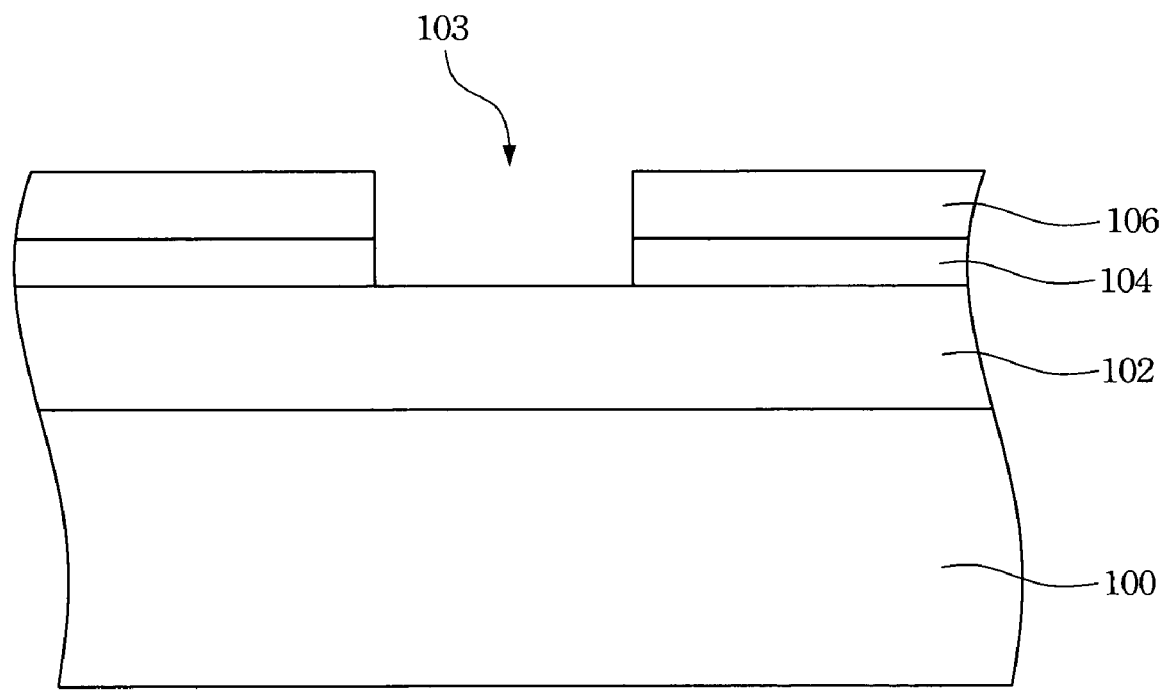

In FIG. 2, a silicon nitride layer 106 and a patterned photoresist layer (not shown in FIG. 2) are sequentially formed on the sacrificial oxide layer 104. Then, an etch process is performed to form an opening 103 in the silicon nitride layer 106 and the sacrificial oxide layer 104 to expose the underlying doped-semiconductor layer 102. After that, the photoresist layer is removed.

Figure 3:
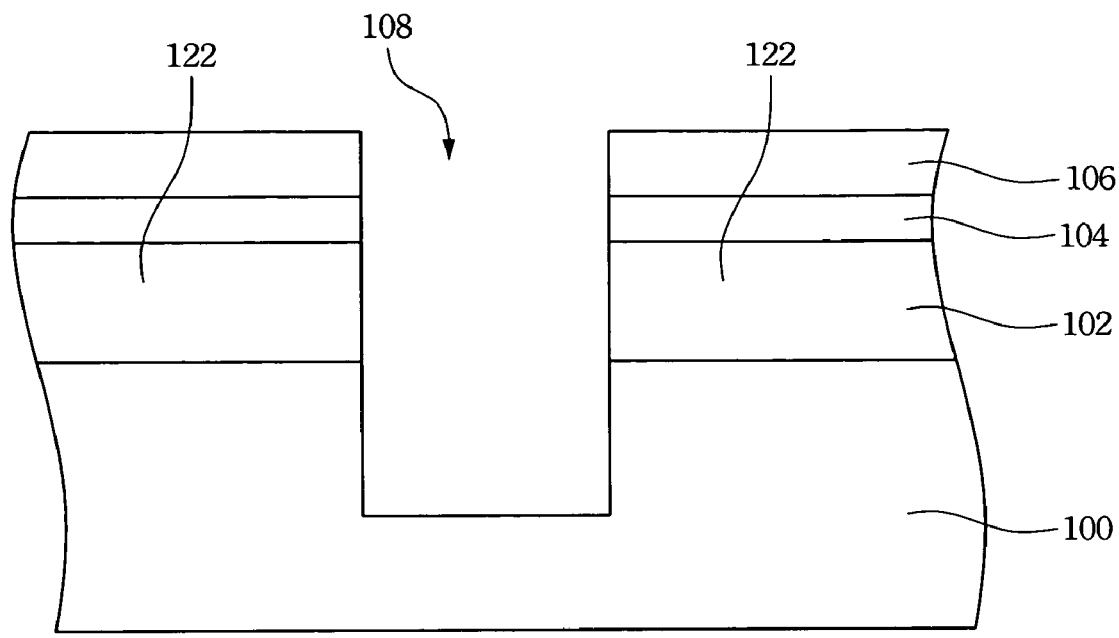

In FIG. 3, the silicon nitride layer 106 and the sacrificial oxide layer 104 are used as a hard mask to etch the doped-semiconductor layer 102 and the substrate 100 to form a trench 108, and then the doped semiconductor layer 102 is separated by the trench 108 to two portions and the source/drain regions 122 is defined.

Figure 4:
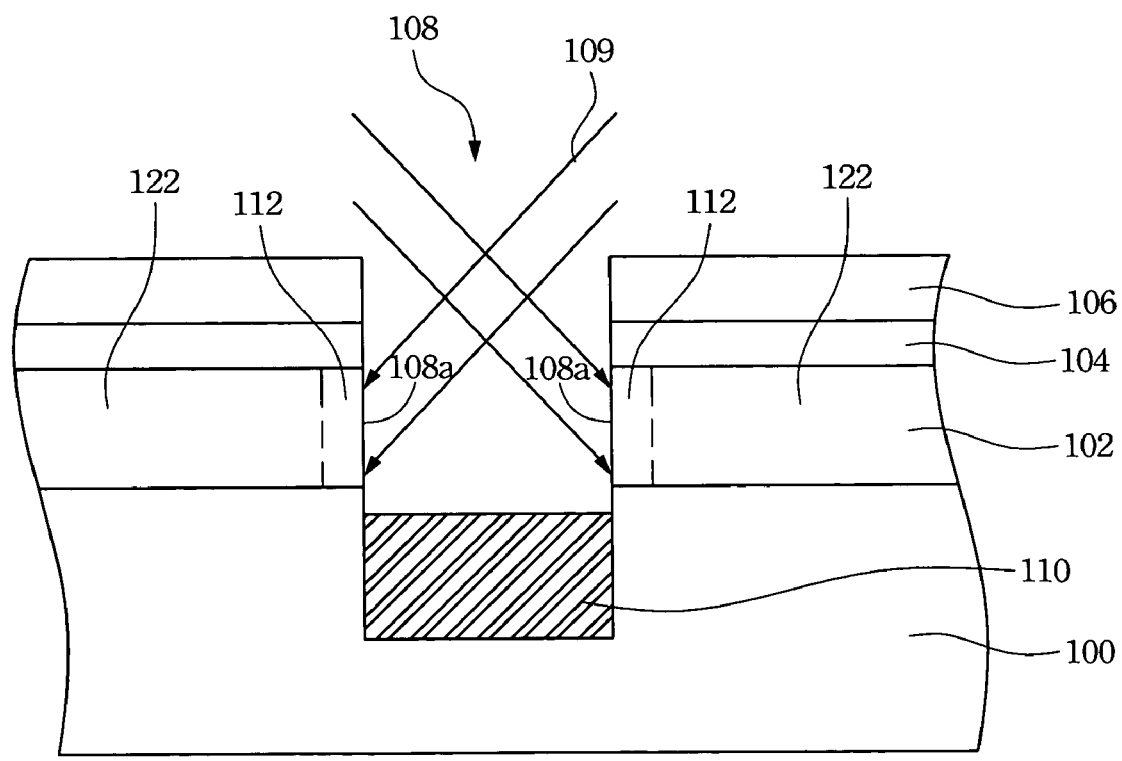

In FIG. 4, after forming a photoresist 110 in the trench 108, a second implantation process 109 with a tilt angle is performed to implant ions from the sidewalls 108a of the trench 108 into the source/drain region 122 to form an implant area 112. The implant area 112 is used to increase the speed of following oxidation process for forming an oxide layer on the sidewalls of the trench 108. The tilt angle is determined by the width of the gate and the desired implant depth. The implant area 112 is located in the portion of source/drain region 122 exposed by the sidewalls of the trench 108. The ions used in the second implantation process are preferably phosphorous, gallium, arsenic, silicon, boron, argon, fluorine or oxygen. According to one embodiment of the present invention, the ion concentration used in the second implantation process is preferably from $e^{14}$ to $e^{15}$.

Figure 5:
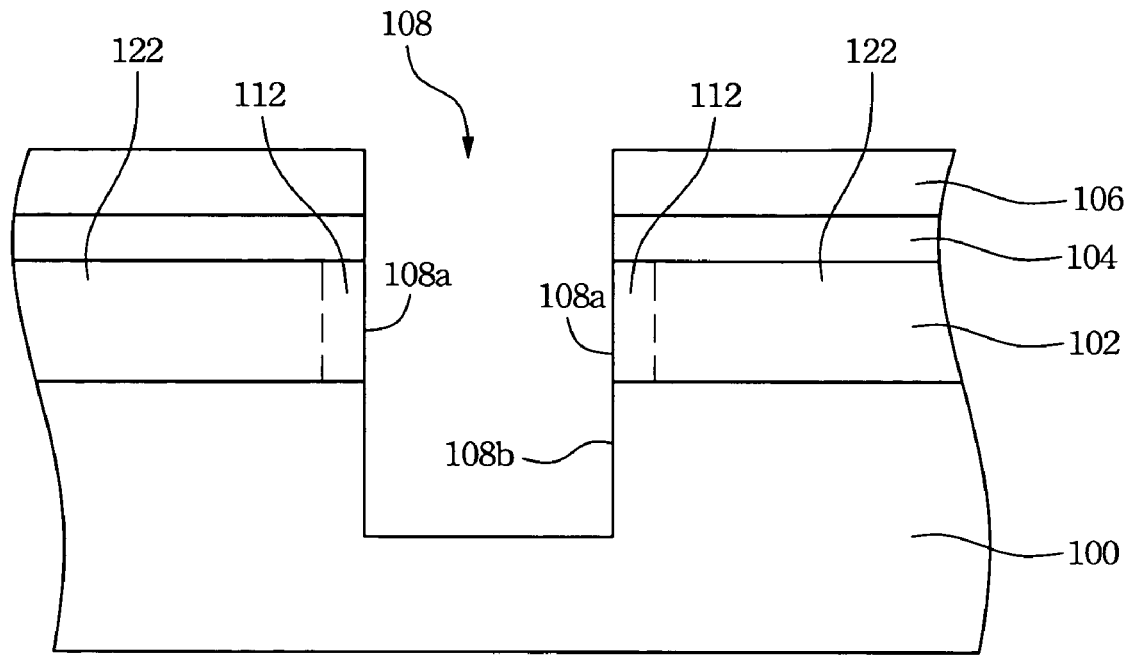
Figure 6:
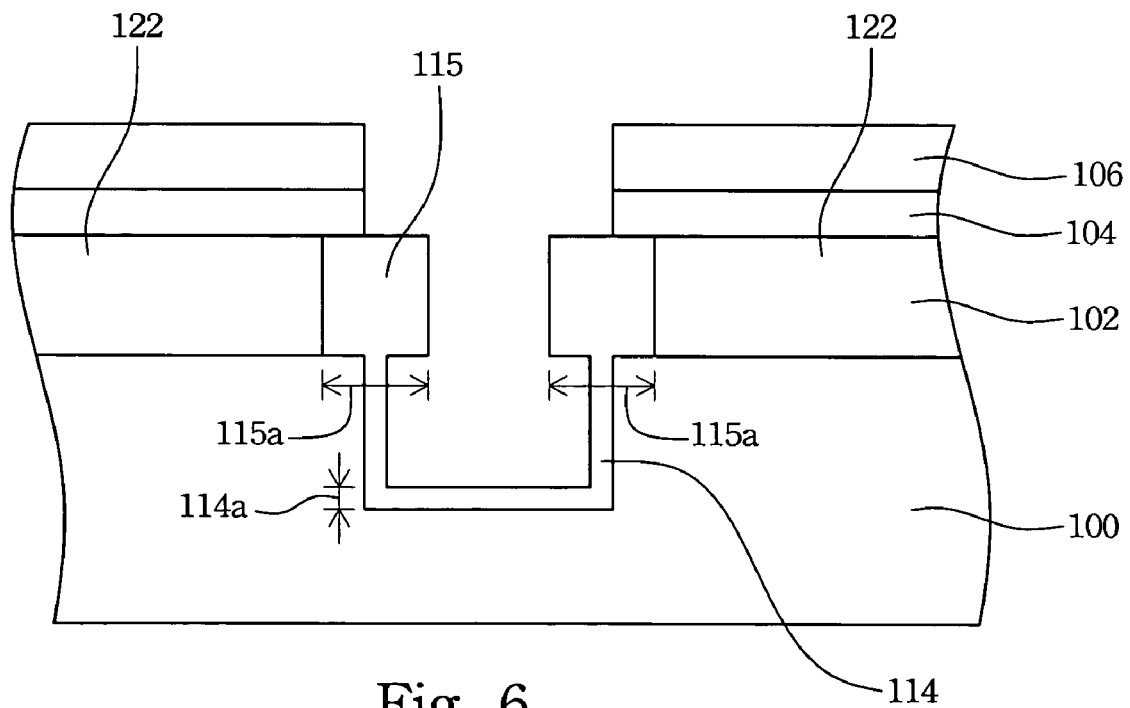

In FIG. 5, the photoresist 110 in the trench 108 illustrated in FIG. 4 is removed. In FIG. 6, a thermal oxidation process is performed to form a gate oxide 114 on the sidewalls 108b and bottom of the trench 108 illustrated in FIG. 5 and to form an isolated oxide 115 on the sidewalls 108a of the trench 108 illustrated in FIG. 5. The gate oxide 114 and the isolation oxide 115 are formed in one oxidation process. The gate oxide 114 having a thickness 114a is thinner than the isolation oxide 115 having a thickness 115a. According to one embodiment of the present invention, the thickness 115a is between 1.5 and 4 times thicker than the thickness 114a.

Figure 7:
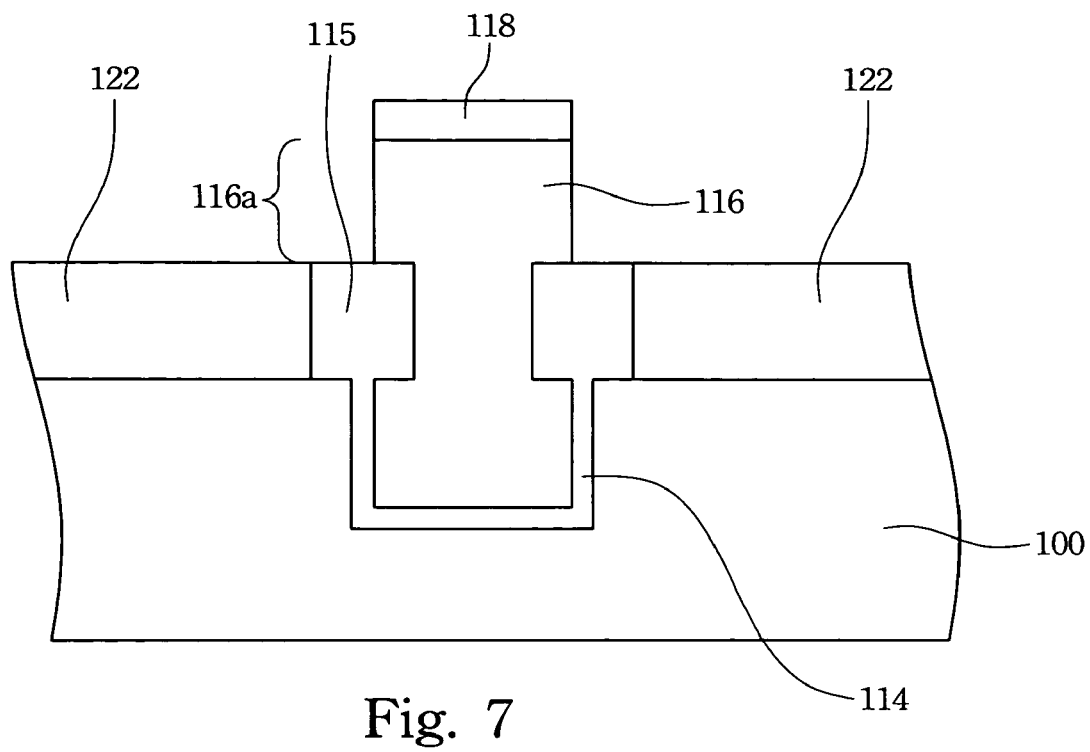

In FIG. 7, after the silicon nitride layer 106 and the sacrificial oxide layer 104 illustrated in FIG. 6. are removed, a gate layer is formed on the source/drain region 122, on the isolation oxide 115 and fills the trench 108. A gate mask layer is sequentially formed on the gate layer. Then, a photolithography process is performed to remove the gate layer and the gate mask layer on the source/drain region 122 to form a gate 116 and a gate mask 118. The upper segment 116a of the gate 116 protrudes over the upper surface of the source/drain region 122.

Figure 8:
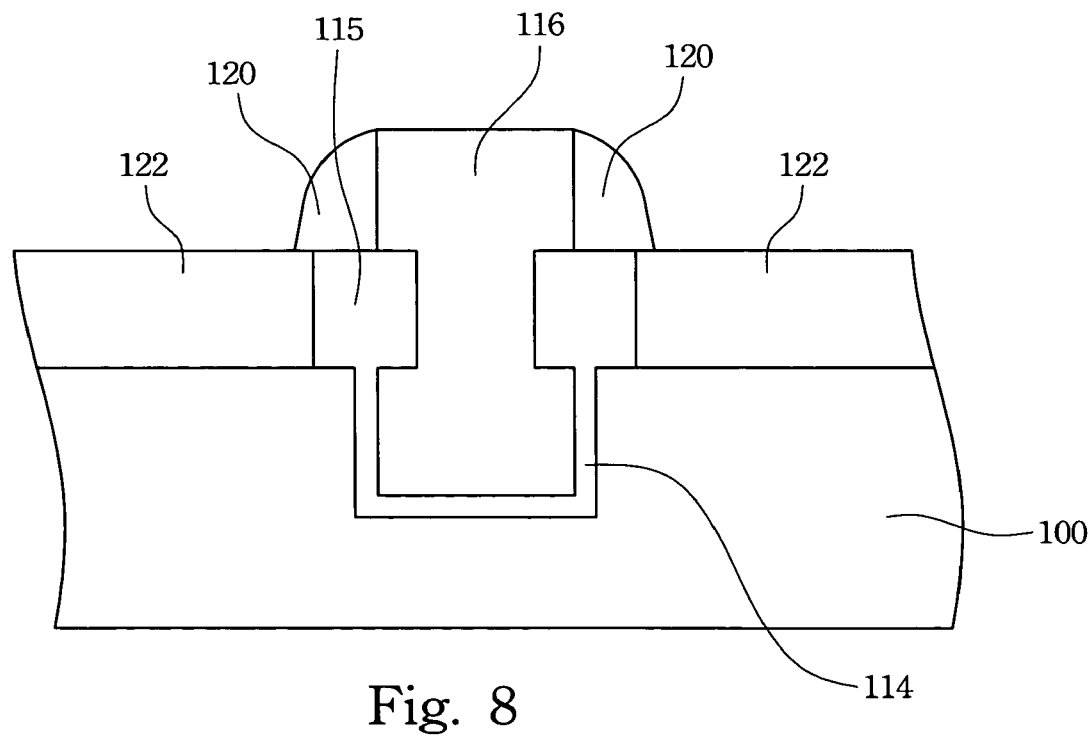

In FIG. 8, after the gate mask 118 is removed, a spacer layer is formed on the source/drain region 122. Then, an anisotropic etch is performed on the spacer layer to form spacers 120 on sidewalls of the gate 116. Therefore, a recess channel transistor is produced.

Thus, in the embodiment of the present invention, the oxidation speed for growing the oxide layer on the sidewalls of a trench is different. The implantation area formed in the source/drain region by an implantation process with a tilt angle is oxidized faster. According to one embodiment of the present invention, ions, such as phosphorous, gallium, arsenic, silicon, boron, argon, fluorine or oxygen, are used to destroy the lattice structure of the active area, or ions with oxidation property, such as oxygen, are used to increase speed of oxidation for forming the oxide layer on the source/drain region of the sidewalls of the trench to obtain thicker isolation oxide located between the gate and source/drain regions during the thermal oxidation process.

Figure 9:
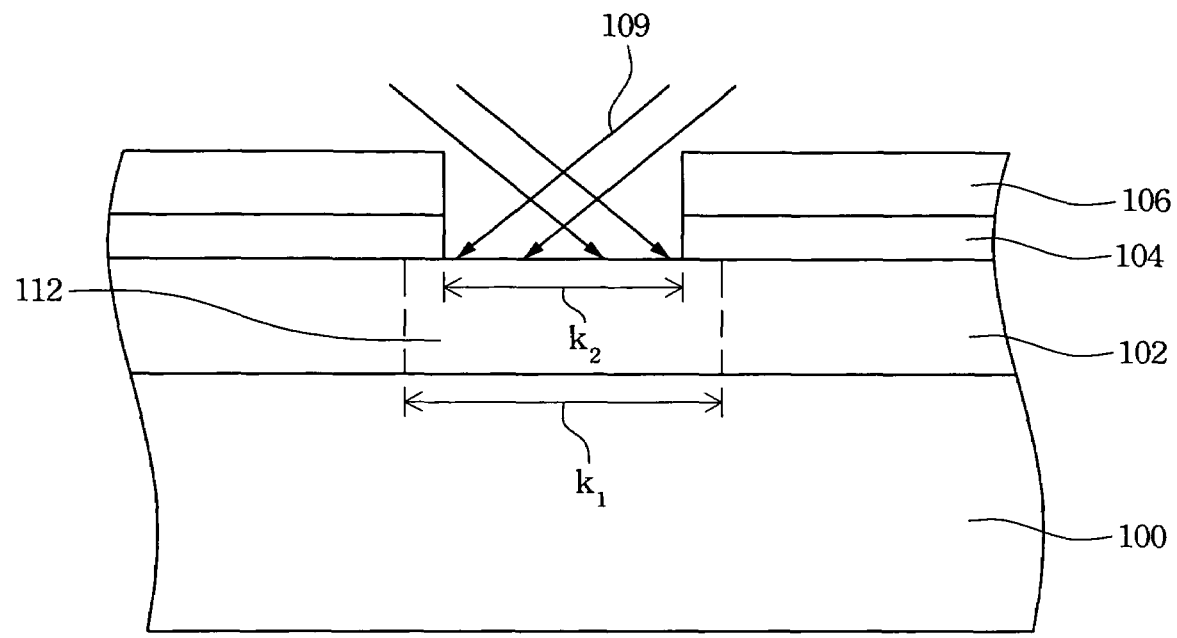
FIGS. 9 and 10 are partial process step cross-sectional diagrams showing a recess channel array transistor according to another embodiment of the present invention.

Alternatively, in another embodiment, an implantation process is performed on the doped-semiconductor layer, and then a trench is formed after the implantation process. First, as the foregoing steps of the foregoing embodiment of the present invention illustrated in FIGS. 1 and 2, a patterned silicon nitride layer 106 and a patterned sacrificial oxide layer 104 are sequentially formed on a doped-semiconductor layer 102 and a substrate 100. The patterned silicon nitride layer 106 and the patterned sacrificial oxide layer 104 comprise an opening 103 to expose the underlying doped-semiconductor layer 102. In FIG. 9, a second implantation process 109 is performed with a tilt angle on the doped-semiconductor layer 102 to form an implant area 112. The width $k_1$ of the implant area 112 is wider than the width $k_2$ of the opening 103 of the patterned silicon nitride layer 106 and the sacrificial oxide layer 104. The tilt angle and ions concentration that can be used in the second implantation process 109 are preferably the same as the foregoing embodiment, so the description relating to those materials is not repeated here.

Figure 10:
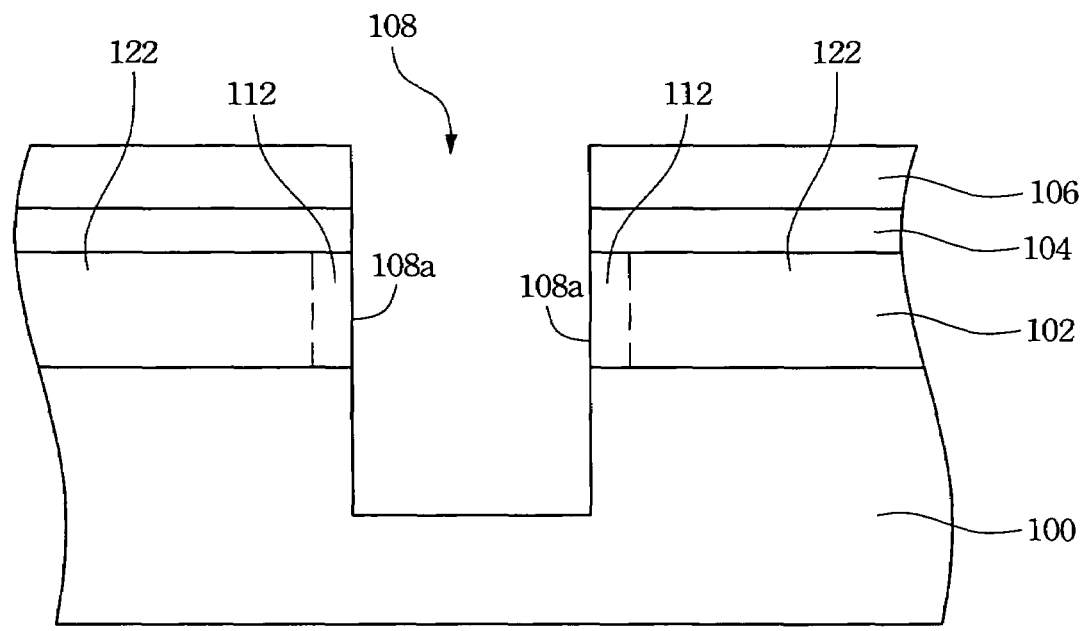

In FIG. 10, the exposed implant area 112 and the substrate 100 are etched to form a trench 108, and then the doped semiconductor layer 102 is separated by the trench 108 to two portions and the source/drain regions 122 is defined. The width $k_1$ of the implant area 112 is wider than the width $k_2$ of the opening 103 so that the partial implant area 112 is residual on the sidewalls 108a of the trench 108 while the patterned silicon nitride layer 106 is used as a mask to etch the exposed implant area 112 and the substrate 100. After that, a recess channel transistor is produced as the foregoing embodiment of the present invention illustrated in FIG. 6 to 8.

Thus, the present invention provides a method of fabricating a recess channel transistor with gate oxide located between the gate and the channel and isolation oxide located between the gate and source/drain regions. The isolation oxide has a thicker thickness than the gate oxide. Moreover, the present invention not only solves problems for gate induced drain leakage, but also reduces parasitic capacitance effect derived from overlapping a source/drain and a gate. Furthermore, the gate oxide and the isolation oxide are formed by one thermal oxidation process.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method of fabricating a recess channel transistor, the method comprising:
    performing a first implantation process to form a doped-semiconductor layer on an upper surface of a substrate;
    forming a patterned hard mask having an opening on the doped-semiconductor layer;
    etching the exposed doped-semiconductor layer and the substrate to form a trench and define a source/drain in the doped semiconductor layer;
    performing a second implantation process with a tilt angle on the source/drain of the sidewalls of the trench to form an implant area;
    performing a thermal oxidation process to form a oxide layer on the sidewalls and the bottom of the trench, wherein the oxide layer comprises a first thickness on the source/drain in the sidewalls of the trench and a second thickness on the other portion in the sidewalls of the trench, and the first thickness is thicker than the second thickness;
    removing the patterned hard mask; and
    forming a gate in the trench.

2. The method of fabricating a recess channel transistor of claim 1, wherein the thickness of the first thickness is between 1.5 to 4 times thicker than the second thickness.

3. The method of fabricating a recess channel transistor of claim 1, wherein the patterned hard mask comprises a silicon nitride layer.

4. The method of fabricating a recess channel transistor of claim 1, wherein ions of the second implantation process is selected from a group consisting of phosphorous, gallium, arsenic, silicon, boron, argon, fluorine and oxygen.

5. The method of fabricating a recess channel transistor of claim 1, further comprising performing an anneal process after performing the first implantation process.

6. The method of fabricating a recess channel transistor of claim 1, further comprising forming a photoresist on the bottom of the trench before performing the second implantation process.

7. The method of fabricating a recess channel transistor of claim 1, wherein the upper segment of the gate is protruded over the upper surface of the substrate.

8. The method of fabricating a recess channel transistor of claim 1, further comprising forming a sacrificial oxide on the substrate before performing the first implantation process.

9. A method of fabricating a recess channel transistor, the method comprising:
    performing a first implantation process to form a doped-semiconductor layer on an upper surface of a substrate;
    forming a patterned hard mask on the doped-semiconductor layer, wherein the patterned hard mask comprises an opening to expose partial of the doped-semiconductor layer;
    performing a second implantation process with a tilt angle on the doped-semiconductor layer to form an implant area, wherein the implant area is wider than the opening of the patterned hard mask in width;
    etching the exposed implant area and the substrate to form a trench;
    performing a thermal oxidation process to form a oxide layer on the sidewalls and bottom of the trench, wherein the oxide layer comprises a first thickness in the sidewalls of the trench and a second thickness on the other portion of the trench, and the first thickness is greater than the second thickness in thickness;
    removing the patterned hard mask; and
    forming a gate in the trench.

10. The method of fabricating a recess channel transistor of claim 9, wherein the thickness of the first thickness is between 1.5 and 4 times thicker than the second thickness.

11. The method of fabricating a recess channel transistor of claim 9, wherein the patterned hard mask comprises a silicon nitride layer.

12. The method of fabricating a recess channel transistor of claim 9, wherein ions of the second implantation process is selected from a group consisting of phosphorous, gallium, arsenic, silicon, boron, argon, fluorine and oxygen.

13. The method of fabricating a recess channel transistor of claim 9, further comprising performing an anneal process after performing the first implantation process.

14. The method of fabricating a recess channel transistor of claim 9, wherein upper segment of the gate is protruded over the upper surface of the substrate.

15. The method of fabricating a recess channel transistor of claim 9, further comprising forming a sacrificial oxide on the substrate before performing the first implantation process.

* * * * *